United States Patent [19]

Botez et al.

[11] 4,383,320

[45] May 10, 1983

[54] POSITIVE INDEX LATERAL WAVEGUIDE SEMICONDUCTOR LASER

[75] Inventors: Dan Botez, Mt. Holly, N.J.; Jerome K. Butler, Richardson, Tex.

[73] Assignee: RCA Corporation, New York, N.Y.

[21] Appl. No.: 257,773

[22] Filed: Apr. 27, 1981

[51] Int. Cl.³ .............................................. H01S 3/19
[52] U.S. Cl. ...................................... 372/45; 357/17; 372/48
[58] Field of Search ................ 372/45, 46, 48; 357/17

[56] References Cited

U.S. PATENT DOCUMENTS

| | | | |
|---|---|---|---|
| 3,753,801 | 8/1973 | Lockwood et al. | 148/171 |
| 4,033,796 | 7/1977 | Burnham et al. | 148/175 |
| 4,092,659 | 5/1978 | Ettenberg | 357/18 |
| 4,178,564 | 12/1979 | Ladany et al. | 331/94.5 |
| 4,215,319 | 7/1980 | Botez | 331/94.5 |
| 4,335,461 | 6/1982 | Streifer et al. | 372/45 |
| 4,347,486 | 8/1982 | Botez | 372/46 |

Primary Examiner—James W. Davie
Attorney, Agent, or Firm—Birgit E. Morris; Donald S. Cohen

[57] ABSTRACT

The invention is an improved semiconductor laser diode which includes a substrate having a pair of substantially parallel grooves in a major surface thereof with a land therebetween, a first confinement layer overlying the major surface of the substrate and the surfaces of the grooves; a guide layer overlying the first confinement layer, an active layer overlying the guide layer and the second confinement layer overlying the active layer. The improvement is a guide layer which tapers in increasing thickness from that portion of the layer over the land and whose surface, contacting the active layer, is concave in shape, and an active layer which is thickest over the land between the grooves and tapers in decreasing thickness in the lateral direction. This structure provides a positive lateral waveguide index for light propagating in the active and guide layers resulting in a reduced threshold current for lasing action and a reduced spontaneous emission near threshold.

7 Claims, 5 Drawing Figures

POSITIVE INDEX LATERAL WAVEGUIDE SEMICONDUCTOR LASER

The Government has rights in this invention pursuant to a Government Contract.

The invention relates to a semiconductor laser which emits a single filament of light and particularly to a semiconductor laser having a positive index waveguide which emits a single filament of light of large cross-sectional area and which has a low lasing threshold current.

BACKGROUND OF THE INVENTION

A semiconductor injection laser comprises a body of semiconductor material, generally a group III–V compound or alloys of such compounds, having a thin active layer between layers of opposite conductivity type, that is, a layer of P-type conductivity on one side of the active layer and a region of N-type conductivity on the other side of the active layer. These layers are typically deposited by liquid phase epitaxy, as is well known. If the surface of a substrate upon which these layers are grown is perturbed, for example, by grooves extending into the surface of the substrate, the layers may be grown with varying thicknesses. These variations arise from the fact that in liquid phase epitaxy the local deposition rate will vary with surface curvature, the greater the local concavity of the surface, the faster the deposition rate.

Botez, in U.S. Pat. No. 4,347,486 filed Apr. 6, 1981 which is a continuation-in-part of U.S. application Ser. No. 84,347 filed Oct. 12, 1979, now abandoned, and entitled "Single Filament Semiconductor Laser with Large Emitting Area," which is incorporated herein by reference, has disclosed a semiconductor laser, known as a CDH-LOC laser, which comprises a body of semiconductor material having a substrate with a pair of spaced, substantially parallel grooves in its surface. A first confinement layer overlies the surface of the substrate and the surfaces of the grooves. A guide layer overlies the first confinement layer and an active layer overlies the first confinement layer. A second confinement layer overlies the active layer. The guide layer has an index of refraction less than that of the active layer but larger than that of either the first or second confinement layers. The substrate, the first confinement layer and the guide layer are of the same conductivity type and the second confinement layer is of the opposite conductivity type. The active layer is the recombination region of the laser. The light beam is generated therein in the portion which is over that part of the substrate between the grooves. The light beam so generated propagates in both the thin active region and, primarily, in the relatively thicker guide layer, thereby forming a laser filament having a large cross-sectional area. This laser also has excellent selectivity against higher order modes of propagation of the generated laser beam since the waveguide formed by the active and guide layers in the lateral direction (the direction in the plane of the layers and perpendicular to the axes of the grooves) exhibits high loss for these modes but has the disadvantages that both the threshold current for lasing action and the spontaneous emission near threshold are higher than is desireable. It would be advantageous to have a CDH-LOC laser which reduced these undesired properties.

SUMMARY OF THE INVENTION

The invention is an improved CDH-LOC laser where the improvement comprises a guide layer having a surface contacting the active layer which has a concave shape in the lateral direction over the land between the grooves and which tapers in increasing thickness away from the land in the lateral direction, and an active layer which is thickest over the land between the grooves and which tapers in decreasing thickness in the lateral direction. This structure provides a positive index lateral waveguide for light propagating in the active and guide layers resulting in a reduced threshold current for lasing action and a reduced spontaneous emission near threshold.

DETAILED DESCRIPTION OF THE INVENTION

Figure 1:
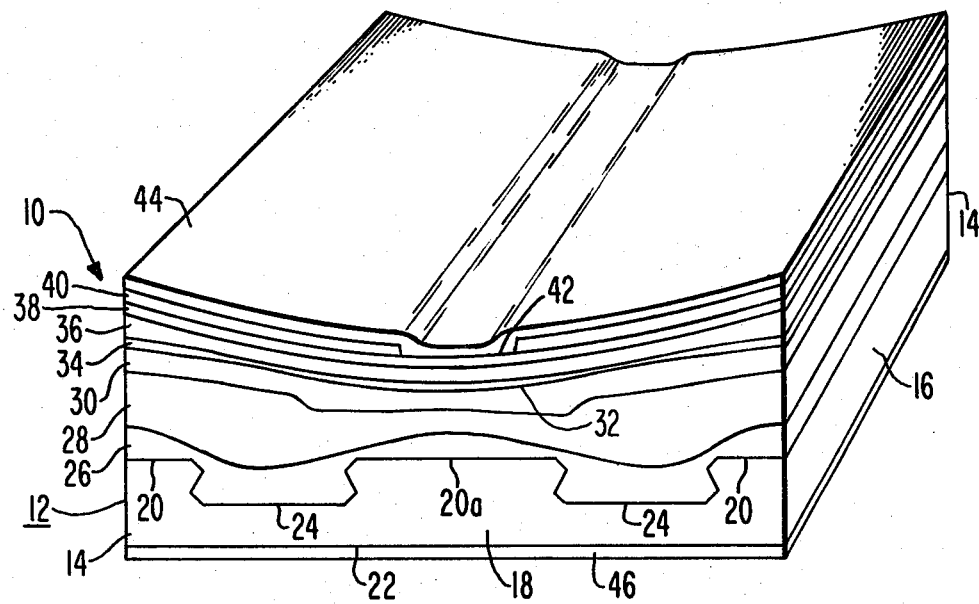
FIG. 1 is a schematic illustration of a perspective view of a semiconductor laser of the invention.

In FIG. 1 a semiconductor injection laser incorporating the present invention is designated as 10. The laser 10 comprises a body 12 of single crystal semiconductor material, typically group III–V compounds or alloys of such compounds, in the form of a parallelopiped. The body 12 has spaced, parallel end surfaces 14 which are partially reflecting of light, with at least one of the end surfaces 14 being partially transparent so that light may be emitted therefrom. The body 12 also includes spaced, parallel side surfaces 16 which extend between and perpendicular to the end surfaces 14.

The semiconductor body 12 includes a substrate 18 having spaced, parallel major surfaces 20 and 22 which extend between and are perpendicular to both the end surfaces 14 and the side surfaces 16 of the semiconductor body 12. In the major surface 20 of the substrate 18 are a pair of spaced, parallel grooves 24 which extend between the end surfaces 14 of the semiconductor body 12. A portion of the major surface 20 between the grooves 24 forms a land 20a. A buffer layer 26 overlies the major surface 20, the land 20a and partially fills each of the grooves 24. A first confinement layer 28 overlies the buffer layer 26. A guide layer 30 overlies the first confinement layer 28 and has a surface 32 which is concave over the portion of the substrate which is over the land 20a and tapers in increasing thickness in the lateral direction. An active layer 34 overlies the surface 32 of the guide layer 30. The portion of the active layer over the land 20a tapers in decreasing thickness in the lateral direction. A second confinement layer 36 overlies the active layer 34. A capping layer 38 overlies the second confinement layer 36. A layer 40 of an electrically insulating material, such as silicon dioxide, overlies the capping layer 38 and has an opening therethrough in the form of a stripe 42 over the land 20a and extending between the end faces 14. An electrically conducting layer 44 overlies the electrically insulating layer 40 and the portion of the capping layer 38 in the region of the stripe 42. A second electrically conducting layer 46 overlies the second major surface 22 of the substrate 18. The electrically conducting layers 44 and 46 form the electrical contacts to the laser 10.

The substrate 18, the buffer layer 26, the first confinement layer 28 and the guide layer 30 are of one conductivity type, either P or N. The second confinement layer 36 and the capping layer 38 have the opposite conductivity type. The active layer 34 may be of either conductivity type but is typically only lightly electrically conducting. It is to be understood that the conductivity types of each of these layers may be reversed so long as the relationships of the conductivities of the various layers described above is maintained.

Figure 2:
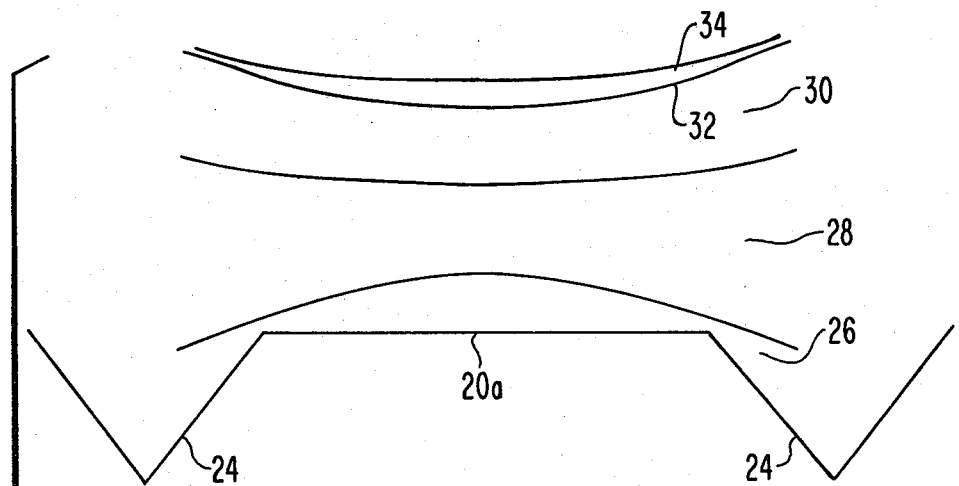
FIG. 2 is a schematic illustration of a sectional view showing the details of the layers of the semiconductor laser on a substrate having vee-shaped grooves.
Figure 3:
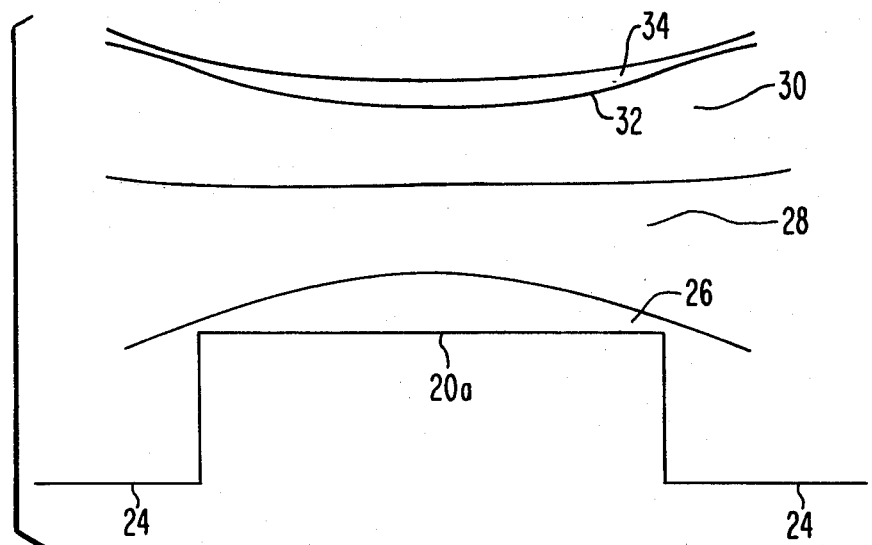
FIG. 3 is a schematic illustration of a sectional view showing the details of the layers of the semiconductor laser on a substrate having rectangular-shaped grooves.

The grooves 24 are shown in FIG. 1 as having a dovetail shape. Alternatively, the grooves 24 may have a different shape, for example, the vee or rectangular shapes as shown in FIGS. 2 and 3 respectively. The only requirement on the shape of the grooves is that it be such that, during growth, the cooperative effect of the grooves is to cause the formation of overlying layers of the desired thickness and taper.

The grooves 24 may be between about 4 and 12 micrometers wide at the surface 20, are typically about 10 micrometers wide, and have a depth of about 4 micrometers. The spacing of the grooves may be between about 20 and about 45 micrometers and is preferably about 32 micrometers. The grooves are formed using standard photolithographic and etching techniques as disclosed, for example, by Botez in U.S. Pat. No. 4,215,319 issued July 29, 1980 and entitled "Single Filament Semiconductor Laser," which is incorporated herein by reference.

The substrate 18 is preferably of n-type gallium arsenide having a top surface 20 which is parallel to the (100) crystallographic plane. The substrate 18 may be misoriented from this orientation but preferably a (100) plane is used. The buffer layer is then comprised of n-type gallium arsenide and is typically between about 0.5 and 1 micrometer thick above the land 20a. The first confinement layer 28 is composed of n-type $Al_wGa_{1-w}As$ where the fractional concentration w of aluminum is between about 0.25 and 0.4 and is typically about 0.3. This layer is typically between about 1.5 and about 2 micrometers thick. The guide layer 30 is typically between about 0.5 and about 2 micrometers thick and is composed of n-type $Al_xGa_{1-x}As$ where the fractional concentration x of aluminum is between about 0.13 and about 0.25 and is typically about 0.20. The active layer is typically between about 0.2 and about 0.4 micrometers thick and is composed of $Al_yGa_{1-y}As$ where the fractional concentration y of aluminum is between about 0.0 and about 0.1. The second confinement layer 36 is typically between about 1 and about 2 micrometers thick and is composed of p-type conductivity $Al_zGa_{1-z}As$ where the fractional concentration z of aluminum varies between about 0.3 and about 0.4 and is typically between about 0.3 and about 0.35. The capping layer 38 may be used to improve the quality of the electrical contact to the laser 10. It is typically between about 0.2 and about 1.5 micrometers thick and is composed of p-type gallium arsenide.

The materials which compose the active layer 34, the guide layer 30 and the first and second confinement layers 28 and 36, respectively, are so chosen that the index of refraction of the active layer 34 is greater than that of the guide layer 30 and the index of refraction of the guide layer 30 is greater than that of either the first or second confinement layers, 28 and 36 respectively. In the wavelength range of interest, the higher the aluminum concentration the lower the index of refraction.

It is to be understood that the use of other combinations of Group III-V alloys may be used in the laser of the invention.

The active layer 34, which is the recombination region of the laser diode, may be either undoped or lightly P- or N-type conducting with the P-N junction thus formed near the interface with either the guide layer 30 or the second confining layer 36 depending upon the conductivity type of the active layer 34.

The various epitaxial layers are deposited on the substrate 18 using well known techniques of liquid phase epitaxy such as are described by Botez in U.S. Pat. No. 4,215,319, referred to above, and by H. F. Lockwood et al in U.S. Pat. No. 3,753,801 issued Aug. 21, 1973 and entitled "Method of Depositing Epitaxial Semiconductor Layers from the Liquid Phase," which is incorporated herein by reference. In liquid phase epitaxy the local growth rate of a portion of an individual layer will vary with the local curvature of the surface upon which it is grown. The greater the amount of local positive curvature of the surface, the higher the local growth rate will be. In the present invention the first confinement layer 28 is grown to a thickness such that the surface of this layer, upon which the guide layer 30 is grown, is concave in shape. The guide layer 30 will then have a higher local growth rate over those portions of the first confining layer 28 having the greatest positive curvature. These portions of the first confining layer 28 will be over the grooves 24 in the substrate 18. The guide layer 30 will then have a concave shape centered over the land 20a between the grooves. The growth rate of the active layer 34 over the guide layer 30 will then be higher over the land 20a than over the grooves 24 thus resulting in an active layer which is thickest over the land 20a and tapers in decreasing thickness in a lateral direction. The net result then is that the guide layer 30 is thinner over the land 20a and tapers in increasing thickness in the lateral direction while the active layer is thickest over the land 20a and tapers in decreasing thickness in the lateral direction as shown in FIGS. 1, 2 and 3.

Devices constructed according to the invention had the following composition: $n^+$-type GaAs buffer layer; n-type $Al_{0.30}Ga_{0.70}As$ first confinement layer; n-type $Al_{0.21}Ga_{0.79}As$ guide layer; undoped $Al_{0.06}Ga_{0.94}As$ active layer; p-type $Al_{0.34}Ga_{0.66}As$ second confinement layer; and a $p^+$-type GaAs capping layer. The active layer tapered laterally from a maximum thickness of 0.27 micrometer over the center point of the land to about 0.2 micrometer at a distance of about 15 micrometers to either side of the center point in the lateral direction. The guide layer tapered from a minimum thickness of about 1.8 micrometers over the center point of the land to a thickness of about 2.1 micrometers at a distance of about 15 micrometers from the center point of the land in the lateral direction.

The electrically insulating layer 40 is preferably composed of silicon dioxide which is deposited on the capping layer 38 by pyrolytic decomposition of a silicon-containing gas, such as silane, in oxygen or water vapor. An opening 42 is formed extending through the electrically insulating layer 40 down to the capping layer 38 over the land 20a between the grooves using standard photolithographic masking techniques and etching processes. The electrically conducting layer 44 is then deposited over the electrically insulating layer 40 and over the capping layer 38 in the region of the opening 42 in the electrically insulating layer. The electrically conducting layer 44 is preferably composed of titanium, platinum and gold and is deposited by sequential evaporation. The electrically conducting layer 46 on the second major surface 22 of the substrate 18 may be formed by vacuum deposition and sintering of tin and gold.

An end face 14 of the body 12 is typically coated with a layer of aluminum oxide or a similar material having a thickness of about ½ wave at the lasing wavelength. Such a layer has been disclosed by Ladany et al in U.S. Pat. No. 4,178,564 issued Dec. 11, 1979 and entitled "Half Wave Protection Layers on Injection Lasers". The opposed end face 14 may be coated with a mirror which is reflecting at the lasing wavelength. This mirror may consist of a layer of an electrical insulator such as silicon dioxide coated with a layer of gold or, alternatively, the mirror may be a multi-layer reflector such as that disclosed by Ettenberg in U.S. Pat. No. 4,092,659 issued May 30, 1978 and entitled "Multi-layer Reflector for Electroluminescent Device".

On application of a voltage with the proper polarity between the electrical conducting layers 44 and 46 of the injection laser 10, electrical current will flow through the stripe opening in the electrically insulating layer 40 and across the junction region. If the current is greater than the lasing threshold value, the light generated upon recombination of the electrons and holes injected into the active layer will support lasing action. Lasing occurs in that portion of the active layer which is directly over the land 20a between the grooves 24. Since the difference in the indices of refraction of the guide layer 30 and the active layer 34 is small, the light generated in the active layer spreads out into the guide layer 30. Light is then confined in the plane transverse to the plane of the p-n junction in both the guide layer 30 and the active layer 34 by the heterojunction between the first confinement layer 28 and the guide layer 30 and between the active layer 34 and the second confinement layer 36.

Figure 4:
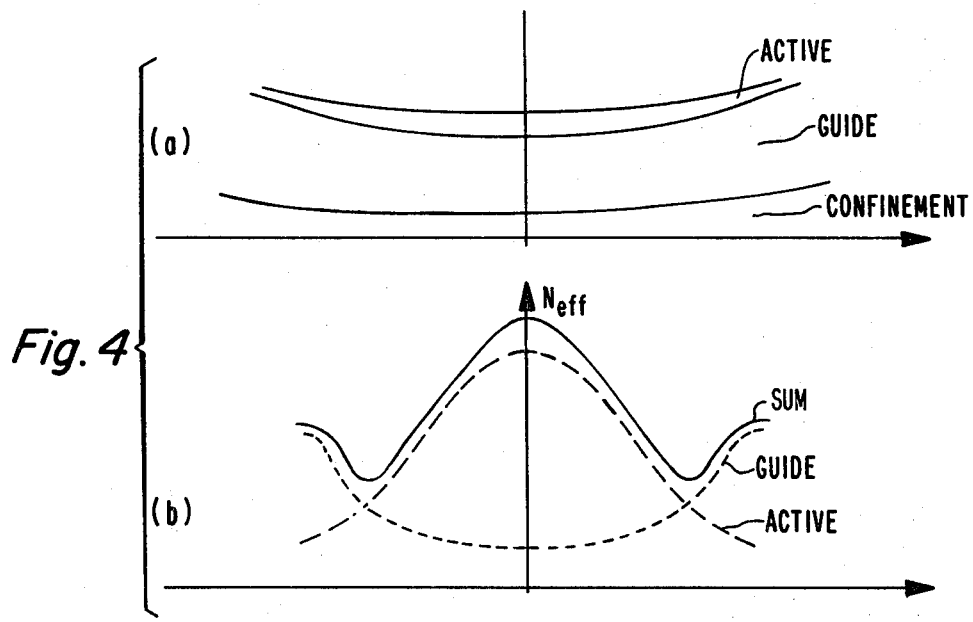
FIG. 4(a) is a schematic illustration of the lateral variation in the thickness of the active and guide layers of a laser of the invention.
FIG. 4(b) is a graphical illustration of the lateral variation in the effective index of refraction of the active and guide layers.

Confinement of the propagating beam in the lateral direction is produced by an effective index of refraction variation arising from the structure of the layers of the device. The lateral thickness variation of the active and guide layers can be translated into a lateral variation in an effective refractive index of the layers as disclosed by Botez in IEEE Journal of Quantum Electronics, QE-17, 178 (1981) for a three layer structure. The effective index of refraction for a four layer structure (including guide layer) is:

$$N_{eff} \sim n_c + G_a(r)(n_2 - n_c) + G_g(r)(n_g - n_c)$$

where $n_a$, $n_g$ and $n_c$ are the bulk refractive indices of the active, guide and confinement layers respectively, and $G_a(r)$ and $G_g(r)$ are the fractional portions of the laser beam power in the active and guide layers respectively as a function of a distance r in the lateral direction from the center point of the land. At the thickest portion of the active layer, over the center point of the land, the power is predominantly located in the active layer. Thus the index of refraction of the active layer dominates. At a distance from the center point in the lateral direction the active layer is thinner, a smaller fraction of the light is propagating in the active layer and a larger fraction is propagating in the guide layer. Thus the index of refraction of the guide layer begins to dominate. FIG. 4 is a graphical illustration of this effect. FIG. 4a shows schematically the relative shapes of the active and guide layers in the lateral direction. FIG. 4b is a graphical illustration of the relative contributions of the active and guide layers to the effective lateral index of refraction $N_{eff}$. The contribution of the active layer decreases while that of the guide layer increases with increasing distance in the lateral direction. The solid line in FIG. 4b, the effective lateral index of refraction, is the sum of the contribution from the active and guide layers. Structures which have such an effective lateral index of refraction profile are called W-guide structures. If the central part of the effective index profile is larger than the side parts a positive index guide structure is obtained. Such structures differ from prior art structures in that, in the present invention, a large fraction of the light beam propagates in the comparatively thick active layer thus producing the positive index structure, while in prior art devices the light beam propagates primarily in the guide layer thus resulting in very little or no contribution to the effective index of refraction by the active layer.

The positive index lateral waveguide structure produces a strong confinement of the propagating light beam in the lateral direction thus reducing the discrimination against higher order propagating modes which is present in other CDH-type injection lasers. The positive index CDH-LOC laser however, has the advantages that since light loss is reduced the threshold current for the onset of lasing action is reduced. We have observed a reduction of a factor of ½ or more in the threshold current and a reduction of more than a factor of 2 in the spontaneous emission from the laser close to the threshold current for lasing action. We have also observed that the side lobes of the lateral far field pattern of the positive index waveguide laser are greatly reduced.

We claim:
1. In a semiconductor laser comprising:
   a body of semiconductor material including a substrate having a pair of opposed major surfaces, a pair of spaced, substantially parallel grooves in a first major surface of the substrate with a land therebetween, and a pair of end surfaces between which the grooves extend, at least one of which is partially transparent to light;
   a first confinement layer overlying the first major surface of the substrate and the surfaces of the grooves;
   a guide layer overlying the first confinement layer;
   an active layer overlying the guide layer;
   a second confining layer overlying the active layer;
   a first electrically conducting layer overlying at least that portion of the second confining layer which is over the land;
   a second electrically conducting layer overlying a portion of the second major surface of the substrate;
   wherein the substrate, first confinement layer and the guide layer are of one conductivity type and the second confinement layer is of the opposite conductivity type and wherein the index of refraction of the active layer is greater than that of the guide layer and the index of refraction of the guide layer is greater than that of the first and second confinement layers; the improvement which comprises:

a guide layer having a surface contacting the active layer which has a concave shape in a lateral direction and which tapers in increasing thickness in the lateral direction from the land; and an active layer which is thickest over the land and which tapers in decreasing thickness in the lateral direction.

2. A semiconductor injection laser diode according to claim 1 wherein the grooves are dovetail shaped.

3. A semiconductor injection laser according to claim 1 wherein the grooves are vee-shaped.

4. A semiconductor injection laser according to claim 1 wherein the grooves are rectangularly shaped.

5. A semiconductor injection laser according to claim 1 further comprising a capping layer overlying the second confinement layer; and an electrically insulating layer overlying the capping layer and having an opening therethrough to expose a stripe of the surface of the capping layer over the land wherein the first electrically conducting layer overlies both the electrically insulating layer and the portion of the surface of the capping layer exposed in the stripe in the electrically insulating layer.

6. In a semiconductor laser comprising;

a body of semiconductor material including a substrate having a pair of major surfaces, a pair of spaced, substantially parallel, dovetail-shaped grooves in a first major surface of the substrate and having a pair of end surfaces, between which the grooves extend, at least one of which is partially transparent to light;

a first confinement layer overlying the first major surface of the substrate and the surfaces of the grooves;

a guide layer overlying the first confinement layer;

an active layer overlying the guide layer;

a second confinement layer overlying the active layer;

a capping layer overlying the second confinement layer;

an electrically insulating layer overlying the capping layer and having an opening therethrough to expose a stripe of the surface of the capping layer;

a first electrically conducting layer overlying the electrically insulating layer and that portion of the capping layer which is exposed through the stripe in the electrically insulating layer;

a second electrically conducting layer overlying a portion of the second major surface of the substrate;

wherein the substrate, the first confinement layer and the guide layer are of one conductivity type and the second confinement layer and the capping layer are of the opposite conductivity type, and wherein the index of refraction of the active layer is greater than that of the guide layer and the index of refraction of the guide layer is greater than that of the first and second confinement layers; the improvement which comprises:

a guide layer having a surface contacting the active layer which has a concave shape in a lateral direction and which tapers in increasing thickness in the lateral direction from the land; and an active layer which is thickest over the land and which tapers in decreasing thickness in the lateral direction.

7. A semiconductor injection laser according to claim 1 or 6 wherein a buffer layer having the same conductivity type as the substrate is interposed between the substrate and the first confinement layer.

* * * * *